United States Patent
Shohet et al.

(10) Patent No.: US 10,090,150 B2
(45) Date of Patent: Oct. 2, 2018

(54) LOW DIELECTRIC CONSTANT (LOW-K) DIELECTRIC AND METHOD OF FORMING THE SAME

(71) Applicant: Wisconsin Alumni Research Foundation, Madison, WI (US)

(72) Inventors: J. Leon Shohet, Madison, WI (US); Huifeng Zheng, Tigard, OR (US); Xiangyu Guo, Madison, WI (US); Weiyi Li, Madison, WI (US); Joshua Blatz, Monona, WI (US); Dongfei Pei, Guilderland, NY (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 15/696,930

(22) Filed: Sep. 6, 2017

(65) Prior Publication Data
US 2018/0068848 A1 Mar. 8, 2018

Related U.S. Application Data

(60) Provisional application No. 62/383,850, filed on Sep. 6, 2016.

(51) Int. Cl.
*H01L 21/02* (2006.01)
(52) U.S. Cl.
CPC .. *H01L 21/02348* (2013.01); *H01L 21/02164* (2013.01)
(58) Field of Classification Search
CPC .................................................. H01L 21/02348
See application file for complete search history.

(56) References Cited

U.S. PATENT DOCUMENTS 7,208,389 B1  4/2007  Tipton et al.

OTHER PUBLICATIONS

Albrecht, M. G., et al., "Materials Issues with Thin Film Hydrogen Silsesquioxane Low-k Dielectrics," Journal of the Electrochemical Society, vol. 145, No. 11, Nov. 1998, pp. 4019-4025.
Aubel, O., et al., "Stress Phenomena in Times of Porous Low-k Dielectrics," AIP Conference Proceedings, vol. 1300, No. 68, Dec. 2010, pp. 68-77.

(Continued)

*Primary Examiner* — Marvin Payen
(74) *Attorney, Agent, or Firm* — Withrow & Terranova, P.L.L.C.

(57) ABSTRACT

A method of forming a low dielectric constant (low-k) dielectric is disclosed. The method includes providing a substrate and forming a dielectric including porogens over the substrate. While subjecting the dielectric to a first pressure, the dielectric is exposed to ultraviolet (UV) radiation. The dielectric is also subject to a second pressure less than $1 \times 10^{-3}$ Torr. While subjecting the dielectric to the second pressure, the dielectric is exposed to vacuum UV (VUV) radiation having one or more photon energies greater than 7 eV. Since it is difficult for VUV radiation to travel through a medium at a pressure greater than 10 Torr without being absorbed by intermittent materials, subjecting the dielectric to the second pressure creates a medium wherein the dielectric can be exposed to the VUV radiation. By exposing the dielectric to UV and VUV radiation, the dielectric can achieve a reduced dielectric constant and increased mechanical properties.

29 Claims, 6 Drawing Sheets

(56) References Cited

OTHER PUBLICATIONS

Baklanov, M. R., "Interconnect Materials Challenges for Sub 20nm Technology Nodes: Ultra Low-k Dielectrics," 2012 IEEE 11th International Conference on Solid-State and Integrated Circuit Technology (ICSICT), Oct. 29-Nov. 1, 2012, Xi'an, China, 3 pages.
Baklanov, M. R., et al., "Effect of Porogen Residue on Electrical Characteristics of Ultra-Low-k Materials," Microelectronic Engineering, vol. 88, Dec. 30, 2010, pp. 990-993.
Baklanov, M.R., et al., eds., "Advanced Interconnects for ULSI Technology," John Wiley & Sons, Ltd., 2012, Chichester, West Sussex, United Kingdom, 597 pages.
Brugler, J. S., et al., "Charge Pumping in MOS Devices," IEEE Transactions on Electronic Devices, vol. 16, No. 3, Mar. 1969, pp. 297-302.
Burkey, D. D., et al., "Structure and Mechanical Properties of Thin Films Deposited from 1,3,5-trimethy1-1,3,5-trivinylcyclotrisiloxane and Water," Journal of Applied Physics, vol. 93, No. 9, May 1, 2003, pp. 5143-5150.
Conley, J. F., et al., "Heavy-Ion-Induced Soft Breakdown of Thin Gate Oxides," IEEE Transactions on Nuclear Science, vol. 48, No. 6, Dec. 2001, pp. 1913-1916.
Edwards, A. H., et al., "Interaction of H and H2 with the Silicon Dangling Orbital at the <111> Si/SiO2 Interface," Physics Review B, vol. 44, No. 4, Jul. 15, 1991, pp. 1832-1838.
Eslava, S., et al., "Ultraviolet-Assisted Curing of Organosilicate Glass Low-k Dielectric by Excimer Lamps," Journal of the Electrochemical Society, vol. 155, No. 11, Sep. 9, 2008, pp. G231-G236.
Gage, D. M., et al., "Effects of UV Cure on Glass Structure and Fracture Properties of Nano-Porous Carbon-Doped Oxide Thin Films," Journal of Applied Physics, vol. 104, No. 043513, Aug. 22, 2008, 8 pages.
Gates, S. M., et al., "Preparation and Structure of Porous Dielectrics by Plasma Enhanced Chemical Vapour Deposition," Journal of Applied Physics, vol. 101, No. 094103, May 2, 2007, 8 pages.
Gerbaud, G., et al., "Spin-Coated and PECVD Low Dielectric Constant Porous Organosilicate Films Studied by 1D and 2D Solid-State NMR," Physical Chemistry Chemical Physics, vol. 11, No. 42, Aug. 24, 2009, pp. 9729-9737.
Gourhant, O., et al., "Crosslinking of Porous SiOCH Films Involving Si—O—C Bonds: Impact of Deposition and Curing," Journal of Applied Physics, vol. 108, No. 124105, Dec. 20, 2010, 9 pages.
Grill, A., "Low and Ultralow Dielectric Films Prepared by Plasma-Enhanced Chemical Vapor Deposition," Dielectric Films for Advanced Microelectronics: Chapter 1, John Wiley & Sons, Ltd., 2007, Chichester, West Sussex, United Kingdom, pp. 1-32.
Grill, A., "Plasma Enhanced Vapor Deposited SiCOH Dielectrics: From Low-k to Extreme Low-k Interconnect Materials," Journal of Applied Physics, vol. 93, No. 3, Feb. 1, 2003, pp. 1785-1790.
Grill, A., "Porous p-SiCOH Ultralow-k Dielectrics for Chip Interconnects Prepared by PECVD," Annual Review of Materials Research, vol. 39, Jan. 13, 2009, pp. 49-69.
Grill, A., et al., "Structure of Low Dielectric Constant to Extreme Low Dielectric Constant SiCOH Films: Fourier Transform Infrared Spectroscopy Characterization," Journal of Applied Physics Letters, vol. 94, No. 10, Nov. 15, 2003, pp. 6697-6707.
Grill, A., et al., "Ultralow Dielectric Constant pSiCOH Films Prepared with Tetramethylcyclotetrasiloxane as a Skeleton Precursor," Journal of Applied Physics, vol. 104, No. 024113, Jul. 24, 2008, 9 pages.
Guo, X., et al., "Effects of Plasma and Vacuum Ultraviolet Exposure on the Mechanical Properties of Low-k Porous Organosilicate Glass," Journal of Applied Physics, vol. 116, No. 044103, Jul. 29, 2014, 9 pages.
Guo, X., et al., "The effect of water uptake on the fracture behavior of low-k organosilicate glass using nanoindentation," Journal of Vacuum Science & Technology A, vol. 32, Apr. 18, 2014, 8 pages.

Guo, X., et al., "The effect of water uptake on the mechanical properties of low-k organosilicate glass," Journal of Applied Physics, vol. 114, Aug. 23, 2013, 11 pages.
Haase, G. S., et al., "Reliability Analysis Method for Low-k Interconnect Dielectrics Breakdown in Integrated Circuits," Journal of Applied Physics, vol. 98, No. 034503, Aug. 9, 2005, 9 pages.
Homma, T., "Low Dielectric Constant Materials and Methods for Interlayer Dielectric Films in Ultralarge-scale Integrated Circuit Multilevel Interconnections," Materials Science and Engineering, vol. R23, Feb. 10, 1998, pp. 243-285.
Huang, H., "Plasma Damaging Process of Porour Ultra-Low-K Dielectrics and Dielectric Repair," Dissertation in Partial Fulfillment of the Requirements for the Degree of Doctor of Philosophy, University of Texas at Austin, Austin, Texas, Aug. 2012, 206 pages.
Iacopi, F., et al., "Short-ranged Structural Rearrangement and Enhancement of Mechanical Properties of Organosilicate Glasses Induced by Ultraviolet Radiation," Journal of Applied Physics, vol. 99, No. 053511, Mar. 8, 2006, 7 pages.
Ito, F., et al., "Improvement of Mechanical Properties of Porous SiOCH Films by Post-Cure Treatments," Advanced Metallization Conference 2005, Sep. 27-29, 2005, Colorado Springs, Colorado, USA, pp. 291-296.
Jousseaume, V., et al., "Comparison Between E-beam and Ultraviolet Curing to Perform Porous a-SiOC:H," Journal of The Electrochemical Society, vol. 154, No. 5, Mar. 12, 2007, pp. G103-G109.
Jousseaume, V., et al., "Plasma-Enhanced-Chemical-Vapor-Deposited Ultralow k for a Post Integration Porogen Removal Approach," Applied Physics Letters, vol. 88, No. 182908, May 5, 2006, 3 pages.
Lauer, J. L, et al., "Charge Trapping within UV and Vacuum UV Irradiated Low-k Porous Organosilicate Dielectrics" Journal of the Electrochemical Society, vol. 157, No. 8, Jun. 3, 2010, pp. G177-G182.
Maex, K., et al., "Low Dielectric Constant Materials for Microelectronics," Journal of Applied Physics, vol. 93, No. 11, Jun. 1, 2003, pp. 8793-8841.
Maier, G., "Low Dielectric Constant Polymers for Microelectronics," Progress in Polymer Science, vol. 26, No. 1, Feb. 2001, pp. 3-65.
Marsik, P., et al., "Porogen Residues Detection in Optical Properties of Low-k Dielectrics Cured by Ultraviolet Radiation," Thin Solid Films, vol. 518, Jan. 11, 2010, pp. 4266-4272.
Massengill, L. W., et al., "Heavy-Ion-Induced Breakdown in Ultra-Thin Gate Oxides and High-k Dielectrics," IEEE Transactions on Nuclear Science, vol. 48, No. 6, Dec. 2001, pp. 1904-1912.
McGahay, V., "Porous Dielectrics in Microelectronic Wiring Applications," Materials, vol. 3, No. 1, Jan. 18, 2010, pp. 536-562.
Morgen, M., et al., "Low Dielectric Constant Materials for ULSI Interconnects," Annual Review of Materials Science, vol. 30, Aug. 2000, pp. 645-680.
Mosig, K., et al., "Integration Challenges of Porous Ultra-low-k Spin-on Dielectrics," Microelectronic Engineering, vol. 64, Nos. 1-4, Oct. 2002, pp. 11-24.
Muller, R. S., et al., "Device Electronics for Integrated Circuits," 3rd Edition, John Wiley & Sons, New York, 2003, 269 pages.
Nakao, S., et al., "UV/EB Cure Mechanism for Porous PECVD/ SOD Low-k SiCOH Materials," 2006 IEEE International Interconnect Technology Conference, Jun. 5-7, 2006, Burlingame, California, USA, pp. 66-68.
Nichols, T., et al., "The effects of plasma exposure and vacuum ultraviolet irradiation on photopatternable low-k dielectric materials," Journal of Applied Physics, vol. 114, No. 104107, Sep. 2013, 6 pages.
Nichols, M. T., et al., "The Effects of Processing Induced Damage on Electrical Conduction Mechanisms and Time-Dependent Dielectric Breakdown of Low-k Organosilicates," Dissertation in Partial Fulfillment of the Requirements for the Degree of Doctor of Philosophy (Electrical and Computer Engineering), University of Wisconsin Madison, Madison, Wisconsin, 2013, 238 pages.
Nichols, M. T., et al., "Time-Dependent Dielectric Breakdown of Plasma-Exposed Porous Organosilicate Glass," Applied Physics Letters, vol. 100, No. 112905, Mar. 15, 2012, 4 pages.

(56) References Cited

OTHER PUBLICATIONS

Nojiri, K., "Dry Etching Technology for Semiconductors," Springer, 2012, Tokyo, Japan, 126 pages.
Oliver, W. C., et al., "An improved technique for determining hardness and elastic modulus using load and displacement sensing indentation experiments," Journal of Materials Research, vol. 7, No. 6, Jun. 1992, pp. 1564-1583.
Prager, L., et al., "Effect of pressure on efficiency of UV curing of CVD-derived low-k material at different wavelengths," Microelectronic Engineering, vol. 85, No. 10, Oct. 2008, pp. 2094-2097.
Ren, H., et al., "Plasma-Processing-Induced Damage of Thin Dielectric Films," Dissertation in Partial Fulfillment of the Requirements for the Degree of Doctor of Philosophy (Electrical and Computer Engineering), University of Wisconsin Madison, Madison, Wisconsin, 2011, 180 pages.
Ren, H., et al., "The Nature of the Defects Generated from Plasma Exposure in Pristine and Ultraviolet-Cured Low-k Organosilicate Glass," Applied Physics Lettrs, vol. 98, No. 252902, Jun. 21, 2011, 4 pages.
Sinha, H., et al., "Numerical Simulation of Vacuum-Ultraviolet Irradiation of Dielectric Layers," Applied Physics Letters, vol. 96, No. 162903, Apr. 8, 2010, 3 pages.
Sinha, H., et al., "Reflectance and Substrate Currents of Dielectrics Layers Under Vacuum Ultraviolet Irradiation," Journal of Vacuum Science & Technology A, vol. 28, No. 6, Sep. 23, 2010, pp. 1316-1318.
Smith, R. S., et al., "Effects of Ultraviolet Radiation on Ultra-Low-Dielectric Constant Thin Film Fracture Properties," Journal of Materials Research, vol. 24, No. 9, Sep. 2009, pp. 2795-2801.
Smith, R. S., et al., "The Effect of Ultraviolet Light Curing on the Material and Fracture Properties of a k~2.5 Low-k Dielectric," Materials Research Society Symposia Proceedings, vol. 990, Apr. 2007, 5 pages.
Stone, D. S., et al., "Elastic rebound between an indenter and a layered specimen: Part I. Model," Journal of Materials Research, vol. 13, No. 11, Nov. 1998, pp. 3207-3213.
Stone, D. S., et al., "Hardness and elastic modulus of TiN based on continuous indentation technique and new correlation," Journal of Vacuum Science and Technology A, vol. 9, No. 4, Jul./Aug. 1991, pp. 2543-2547.
Treichel, H., et al., "Low Dielectric Constant Materials for Interlayer Dielectric," Microelectronic Engineering, vol. 40, No. 1, Feb. 1, 1998, pp. 1-19.
Tsutomu, O., "Thermal Effect of Visible Light and Infra-red Radiation (IR-A, IR-B and IR-C) on the Eye: A Study of Infra-red Cataract Based on a Model," Annals of Occupational Hygiene, vol. 38, No. 4, Jan. 1994, pp. 351-359.
Urbanowicz, A. M., et al., "Improving Mechanical Robustness of Ultralow-k SiOCH Plasma Enhanced Chemical Vapor Deposition Glasses by Controlled Porogen Decomposition Prior to UV-Hardening," Journal of Applied Physics, vol. 107, No. 104122, May 27, 2010, 7 pages.
Vanstreels, K., et al., "Nanoindentation Study of Thin Plasma Enhanced Chemical Vapor Deposition SiCOH Low-k films Modified in He/H2 Downstream Plasma," Journal of Vacuum Science & Technology B, vol. 28, No. 1, Jan./Feb. 2010, pp. 173-179.
Volinsky, A. A., et al., "Fracture Toughness, Adhesion and Mechanical Properties of Low-k Dielectric Thin Films Measured by Nanoindentation," Thin Solid Films, vol. 429, Feb. 14, 2003, pp. 201-210.
Volksen, W., et al., "Mechanical Enhancement of Low-k Organosificates by Laser Spike Annealing," Journal of the Electrochemical Society, vol. 155, No. 10, Aug. 29, 2008, pp. G224-G230.
Wang, L., et al., "Nanoindentation analysis of mechanical properties of low to ultralow dielectric constant SiCOH films," Journal of Materials Research, vol. 20, No. 8, Aug. 1, 2005, pp. 2080-2093.
Woodworth, J., et al., "Absolute Intensities of the Vacuum Ultraviolet Spectra in a Metal-Etch Plasma Processing Discharge," Journal of Vacuum Science & Technology A, vol. 17, No. 6, Nov./Dec. 1999, pp. 3209-3217.
Zheng, H., "Vacuum Ultraviolet Curing of Low-k Organosilicate Dielectrics," Doctoral Dissertation, University of Wisconsin-Madison, Feb. 29, 2016, Madison, Wisconsin, USA, 132 pages.
Zheng, H., et al., "Bandgap measurements of low-k porous organosilicate dielectrics using vacuum ultraviolet irradiation," Applied Physics Letters, vol. 104, No. 062904, Feb. 11, 2014, 4 pages.
Zheng, H., et al., "Effect of vacuum-ultraviolet irradiation on the dielectric constant of low-k organosilicate dielectrics," Applied Physics Letters, vol. 105, Nov. 17, 2014, 4 pages.
Zheng, H., et al., "Effects of Vacuum Ultraviolet Radiation on Trapped Charges and Leakage Currents of Low-k Organisilicate Dielectrics," Applied Physics Letters, vol. 106, No. 192905, May 15, 2015, 4 pages.
Zheng, H., et al., "Nonthermal combined ultraviolet and vacuum-ultraviolet curing process for organosilicate dielectrics," Applied Physics Letters, vol. 108, Jun. 15, 2016, 4 pages.
Eslava, S., et al., "Optimal Property Changes in Low-k Films upon Ultraviolet-Assisted Curing," Journal of the Electrochemical Society, vol. 155, No. 5, Mar. 18, 2008, pp. G115-G120.

LOW DIELECTRIC CONSTANT (LOW-K) DIELECTRIC AND METHOD OF FORMING THE SAME

RELATED APPLICATIONS

This application claims the benefit of U.S. Provisional Patent Application Ser. No. 62/383,850, filed Sep. 6, 2016, the disclosure of which is hereby incorporated herein by reference in its entirety.

GOVERNMENT SUPPORT

This invention was made with government support under CBET1066231 awarded by the National Science Foundation. The government has certain rights in the invention.

FIELD OF THE DISCLOSURE

The technology of the disclosure relates generally to dielectrics and more particularly to curing dielectrics using ultraviolet (UV) and vacuum UV (VUV) radiation.

BACKGROUND

To fabricate high-speed ultra large-scale integration (ULSI) devices, low dielectric constant (i.e., low-k) dielectrics are utilized in back-end-of-the-line processes (i.e., where a transistor is connected to the rest of an integrated circuit) to reduce signal-propagation delay. To reduce the dielectric constant of insulators to an even lower value, porous organosilicate low-k dielectrics, such as SiCOH for example, can be used. Some techniques use plasma-enhanced chemical-vapor deposition (PECVD) using porogen incorporation. The porogens can be removed with a post-deposition treatment, such as thermal annealing with ultraviolet (UV) exposure, resulting in a porous SiCOH film with low-k properties. The mechanisms of UV curing have been widely investigated. Specifically, CHx dissociation and Si—O—Si cross-linking enhancement contributes to the phenomena of porogen removal and improvement of mechanical properties in low-k thin films. However, due to Si—CH3 scission during UV curing, a tradeoff exists between strengthening mechanical properties and reducing the dielectric constant: a longer UV-curing time can achieve better mechanical strength, but it can also increase the dielectric constant. Furthermore, conventional UV curing processes can typically require simultaneous thermal heating, which can result in the deterioration of the films.

SUMMARY

The present disclosure relates to a low dielectric constant (low-k) dielectric and method of forming the same. Related devices, methods, and systems are also disclosed. According to an exemplary method of forming a low-k dielectric, providing a substrate and forming a dielectric including porogens over the substrate is disclosed. The dielectric is subject to a first pressure greater than 10 Torr. While subjecting the dielectric to the first pressure, the dielectric is exposed to ultraviolet (UV) radiation having one or more photon energies less than or equal to seven electron volts (7 eV). The dielectric is also subject to a second pressure less than $1 \times 10^{-3}$ Torr. While subjecting the dielectric to the second pressure, the dielectric is exposed to vacuum UV (VUV) radiation having one or more photon energies greater than 7 eV.

Since it is difficult for VUV radiation to travel through a medium at a pressure greater than 10 Torr without being absorbed by intervening materials, subjecting the dielectric to the second pressure less than $1 \times 10^{-3}$ Torr creates a medium wherein the dielectric can be exposed to the VUV radiation. By exposing the dielectric to UV and VUV radiation, the dielectric can achieve a reduced dielectric constant as well as increased mechanical properties. In some aspects, the dielectric is an organosilicate. In other aspects, the dielectric is not heated by an external heat source during the exposure to the UV radiation and the exposure to the VUV radiation. In some aspects, the dielectric is exposed to the UV radiation before it is exposed to the VUV radiation.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
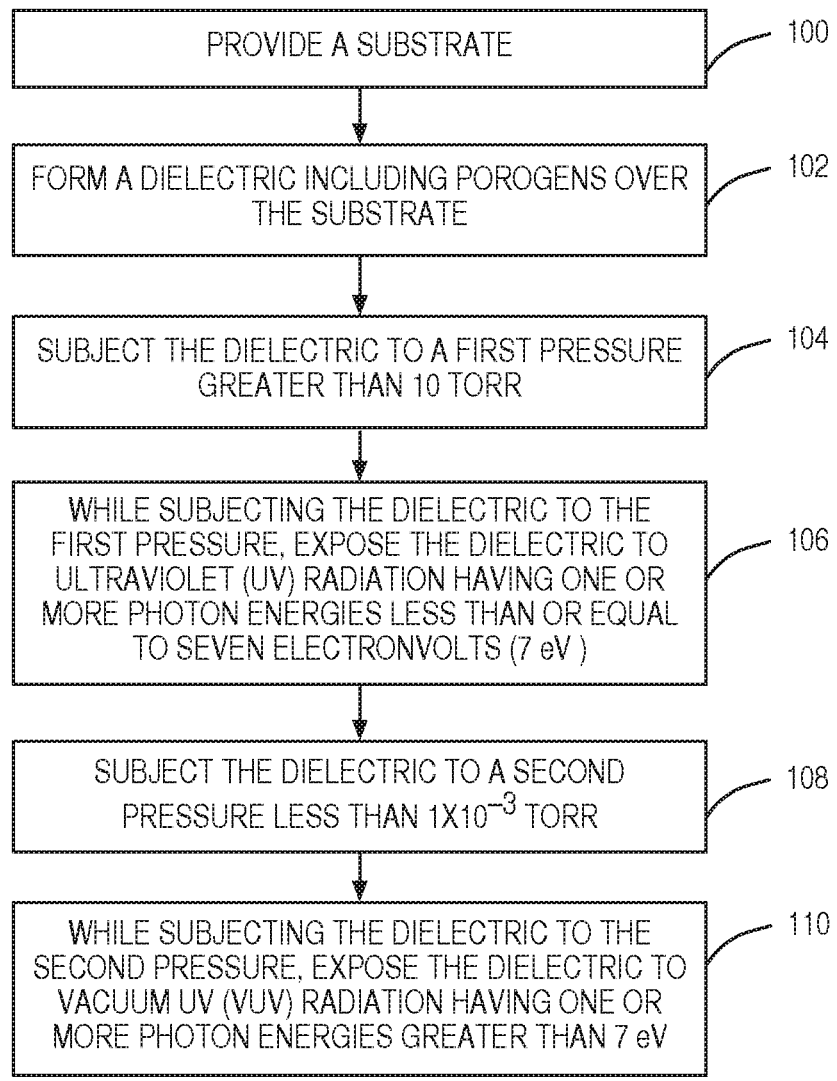
FIG. 1 is a flowchart illustrating an exemplary process of forming a low dielectric constant (low-k) dielectric by exposing the dielectric to ultraviolet (UV) and vacuum UV (VUV) radiation.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a low-k dielectric and method of forming the same. Related devices, methods, and systems are also disclosed. According to an exemplary method of forming the low-k dielectric, providing a substrate and forming a dielectric including porogens over the substrate is disclosed. The dielectric is subject to a first pressure greater than 10 Torr. While subjecting the dielectric to the first pressure, the dielectric is exposed to ultraviolet (UV) radiation having one or more photon energies less than or equal to seven electron volts (7 eV). The dielectric is also subject to a second pressure less than $1 \times 10^{-3}$ Torr. While subjecting the dielectric to the second pressure, the dielectric is exposed to vacuum UV (VUV) radiation having one or more photon energies greater than 7 eV.

Since it is difficult for VUV radiation to travel through a medium at a pressure greater than 10 Torr without being absorbed by intervening materials, subjecting the dielectric to the second pressure less than $1 \times 10^{-3}$ Torr creates a medium wherein the dielectric can be exposed to the VUV radiation. By exposing the dielectric to UV and VUV radiation, the dielectric can achieve a reduced dielectric constant as well as increased mechanical properties. In some aspects, the dielectric is an organosilicate. In other aspects, the dielectric is not heated by an external heat source during the exposure to the UV radiation and the exposure to the VUV radiation. In some aspects, the dielectric is exposed to the UV radiation before it is exposed to the VUV radiation.

Figure 2A:
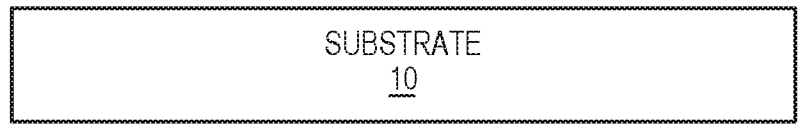
FIGS. 2A-2D illustrate forming the low-k dielectric according to the exemplary process of FIG. 1.

FIG. 1 is a flowchart of an exemplary process for forming a low-k dielectric. FIGS. 2A-2D are cross-sectional views that graphically illustrate the process. The process begins with providing a substrate 10, as illustrated in FIG. 2A (step 100). The substrate 10 can include materials such as, but not limited to, silicon (Si), copper (Cu), aluminum (Al), and the like.

Figure 2B:
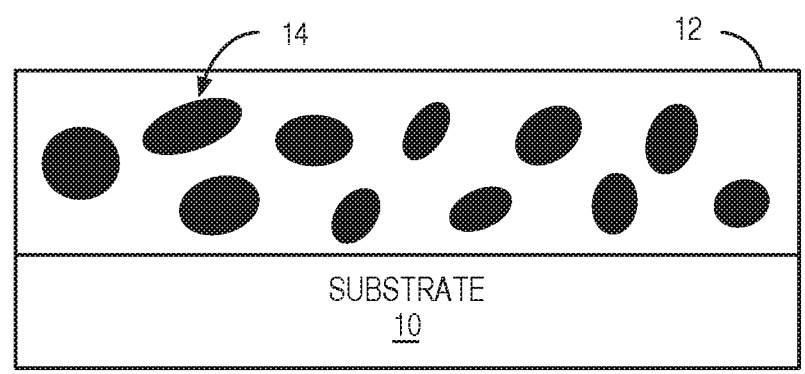

Next, a dielectric 12 is formed over the substrate 10, as illustrated in FIG. 2B (step 102). The dielectric 12 includes porogens 14, which are particles that leave pores (i.e., voids or cavities) upon removal. The dielectric 12 can include materials such as, but not limited to, SiCOH and/or organosilicates, and can be formed over the substrate 10 using processes such as, but not limited to, plasma-enhanced chemical-vapor deposition (PECVD) and/or sputter deposition. The porogens 14 are included in the dielectric 12 to be used in a later step to decrease the dielectric constant by creating pores. The porogens 14 can include materials such as, but not limited to, hydrocarbons, and/or other porogens, and can be incorporated into the dielectric 12 using processes such as, but not limited to, PECVD, sputter deposition, atomic layer deposition, and/or physical vapor deposition. The porogens 14 can be included in the dielectric 12 in concentrations in ranges such as, but not limited to, from approximately zero to approximately 100%.

Figure 2C:
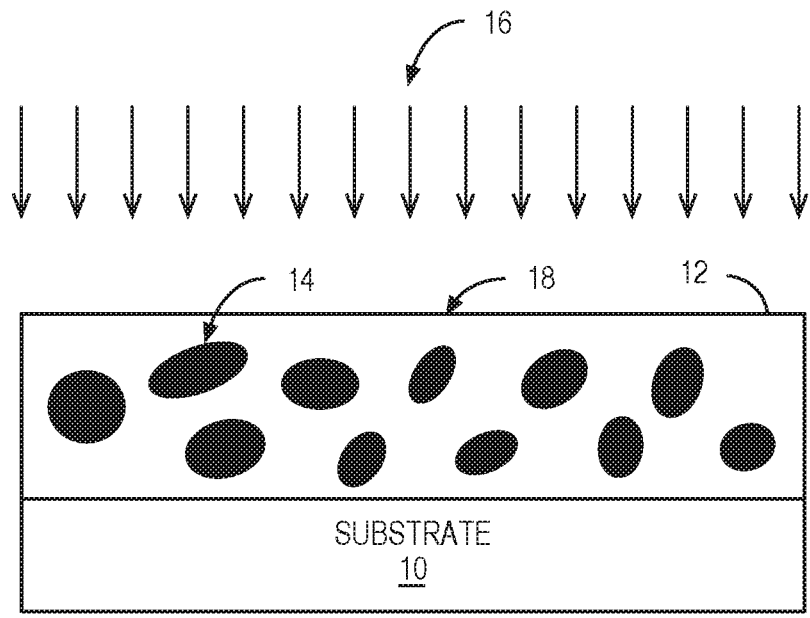

After the dielectric 12 is formed, the dielectric 12 is subjected to a first pressure greater than 10 Torr (step 104) and then exposed to UV radiation 16 having one or more photon energies less than or equal to 7 eV (i.e., 177 nm wavelength) while subjecting the dielectric 12 to the first pressure (step 106), as illustrated in FIG. 2C. The dielectric 12 can be situated in a vacuum chamber having a controlled pressure environment in order to subject the dielectric 12 to the first pressure. In this manner, the permeability and permittivity of the medium through which the UV radiation 16 travels to the dielectric 12 can be controlled. The vacuum chamber can include devices such as, but not limited to, devices made of glass, stainless steel, aluminum, brass, copper, polymers, and/or other plastics, and can be designed to create pressures such as, but not limited to, between 1000 Torr and $1 \times 10^{-12}$ Torr when applying the UV radiation 16. For example, the first pressure can be between 10 Torr and up to and including 1000 Torr.

Figure 2D:
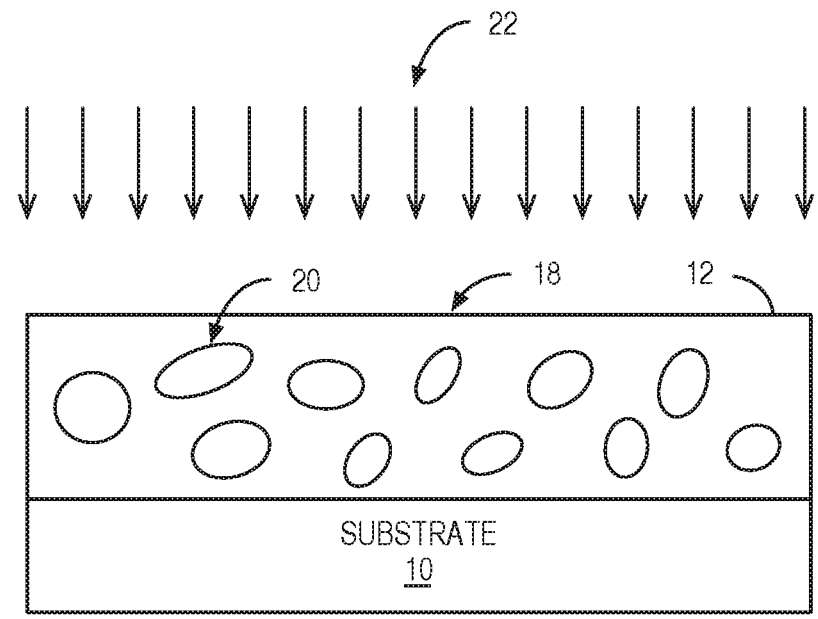

As illustrated in FIG. 2C, the UV radiation 16 is normally incident on a top surface 18 of the dielectric 12 and has a photon energy of about 6.2 eV. The UV radiation 16 can be generated by devices such as, but not limited to, a synchrotron, a plasma reactor, and/or a device configured to provide exposure to radioactive materials. The UV radiation 16 having one or more photon energies less than or equal to 7 eV can also include UV radiation in ranges such as, but not limited to, between 3 eV (413 nm) and 7 eV, between 5.5 eV (225.27 nm) and 7 eV, and between 6 eV (206.5 nm) and 6.5 eV (190.62 nm). By exposing the dielectric 12 to the UV radiation 16, the porogens 14 can be removed, leaving pores 20, as illustrated in FIG. 2D. The pores 20 are essentially air or other gas-filled voids or cavities.

Since air has a very low dielectric constant (where k is approximately one (1)), the pores 20 can make the dielectric constant of the dielectric 12 much lower than that of a solid dielectric. However, generating the pores 20 in the dielectric 12 can reduce the mechanical integrity of the dielectric 12 by reducing the elastic modulus and/or the hardness of the dielectric 12. To increase the mechanical integrity of the dielectric 12, the dielectric 12 is exposed to the UV radiation 16; however, exposing the dielectric 12 to the UV radiation 16 for too long can increase the dielectric constant of the dielectric 12. Exposing the dielectric 12 to the UV radiation 16 can also increase the number of trapped charges within the dielectric 12. Further, porogen residue not removed by the UV radiation 16 can induce a higher conductivity within the dielectric 12 that can result in increased leakage current and a decreased breakdown voltage.

Thus, to maintain mechanical integrity while keeping the dielectric constant low, the dielectric 12 is subjected to a second pressure less than $1 \times 10^{-3}$ Torr, which is a vacuum (step 108) and then exposed to VUV radiation 22 having one or more photon energies greater than 7 eV, while subjecting the dielectric 12 to the second pressure (step 110). The second pressure can be created by the vacuum chamber discussed above or by devices such as, but not limited to, devices made of glass, stainless steel, aluminum, brass, copper, polymers, and/or other plastics. The second pressure can have a pressure such as, but not limited to, less than $1 \times 10^{-4}$ Torr, between $1 \times 10^{-4}$ Torr and $1 \times 10^{-7}$ Torr, approximately $1 \times 10^{-5}$ Torr, and/or between $1 \times 10^{-4}$ Torr and approximately $1 \times 10^{-12}$ Torr when applying the VUV radiation 22 (step 110), as illustrated in FIG. 2D. Since the dielectric 12 is exposed to the UV radiation 16 before it is exposed to the VUV radiation 22 in this example, the porogens 14 illustrated in FIGS. 2B and 2C have been removed to form the pores 20 in FIG. 2D. However, porogen residue may still be present in the dielectric 12.

In the example illustrated in FIG. 2D, the VUV radiation 22 is normally incident on the top surface 18 of the dielectric 12 and has a photon energy of about 8.8 eV. Further, the VUV radiation 22 in this example has a photon fluence of approximately $1 \times 10^{15}$ photons per centimeter squared, which is the amount of radiation energy (i.e., the number of photons) delivered to a unit area. In other embodiments, the photon fluence can have values such as, but not limited to, greater than or equal to $1 \times 10^{14}$ photons per centimeter squared, greater than or equal to $1 \times 10^{15}$ photons per centimeter squared, between $1 \times 10^{14}$ photons per centimeter squared and $1 \times 10^{16}$ photons per centimeter squared, between $1 \times 10^{14}$ photons per centimeter squared and $1 \times 10^{17}$ photons per centimeter squared, and between $1 \times 10^{15}$ photons per centimeter squared and $1 \times 10^{16}$ photons per centimeter squared in different embodiments. The VUV radiation 22 can be generated by devices such as, but not limited to, a synchrotron, a plasma reactor, and/or a device configured to provide exposure to radioactive materials. The VUV radiation 22 having one or more photon energies greater than 7 eV can include VUV radiation in ranges such as, but not limited to, between 7.25 eV (170.9 nm) and 12 eV (103.25 nm), between 8 eV (154.88 nm) and 9.5 eV (130.42 nm), and between 8.3 eV (149.28 nm) and 8.9 eV (139.21 nm).

By exposing the dielectric 12 to the VUV radiation 22, the number of trapped charges in the dielectric 12 can be reduced, because the trapped charges can absorb energy from the VUV radiation 22 and be photoemitted. Further, the VUV radiation 22 can remove the porogen residue still present in the dielectric 12. In this manner, defect states can be passivated and electrical activity mitigated since trapped charges are shifted out of the band-gap of the dielectric 12. In the illustrated embodiments, the dielectric 12 can have a dielectric constant such as, but not limited to, between 2.75 and 2.65, and/or between 3.00 and 2.00 before being exposed to the UV radiation 16 and the VUV radiation 22. The dielectric 12 can have an elastic modulus such as, but not limited to, between 5.3 and 5.7 gigapascals (GPa) before being exposed to the UV radiation 16 and the VUV radiation 22.

As indicated above, the VUV radiation 22 can also enhance the mechanical properties of the dielectric 12. In at least some embodiments, the mechanical properties of the dielectric 12 can be enhanced when the VUV radiation 22 has one or more photon energies greater than 8.2 eV (151.1 nm). In this example, the VUV radiation 22 equal to 8.8 eV can provide such enhanced mechanical properties. The VUV radiation 22 may enhance the mechanical properties, such as the elastic modulus or the hardness of the dielectric 12, in this example, by allowing a photon-assisted reaction that increases the number of bridging Si—O—Si bonds in the dielectric 12. The VUV radiation 22 may also enhance the mechanical properties of the dielectric 12 by providing a more pronounced conversion of the Si—O—Si bond from a cage configuration to a more energetically stable network.

Figure 3:
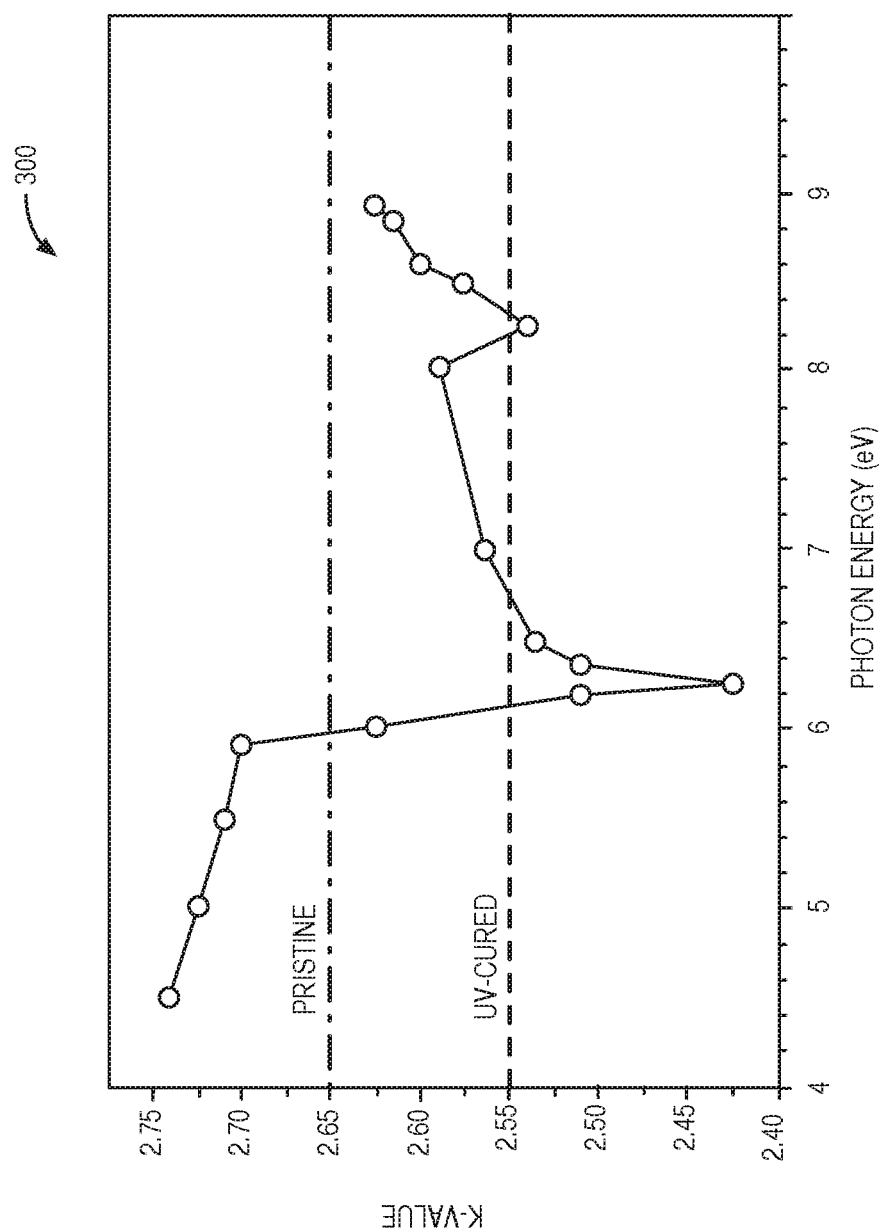
FIG. 3 is a graph illustrating how exposure to radiation at varying photon energies can affect a dielectric constant of a dielectric.
Figure 4:
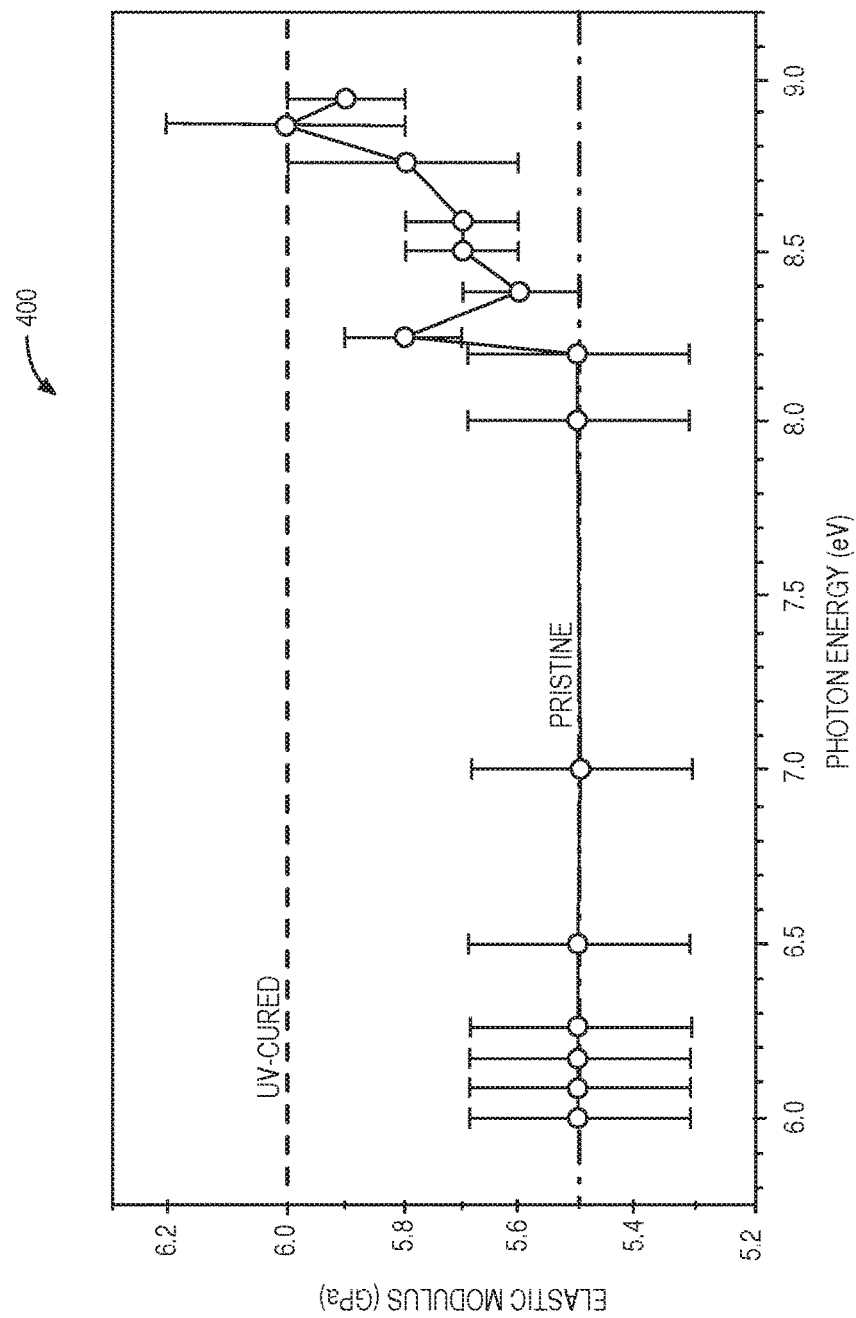
FIG. 4 is a graph illustrating how exposure to radiation at varying photon energies can affect an elastic modulus of a dielectric.

FIGS. 3 and 4 are graphs 300 and 400, respectively, which illustrate how exposure to radiation at varying photon energies can affect the dielectric constant and the elastic modulus of the dielectric 12. As such, the graphs 300 and 400 in FIGS. 3 and 4 are discussed with respect to the exemplary process steps illustrated in FIGS. 1 and 2A-2D. The photon energy on the X-axis of each of the graphs 300 and 400 illustrates the amount of energy each photon has at a given radiation value. Each photon energy corresponds to a wavelength of each radiation value. For example, the UV radiation 16 in FIG. 2C has a photon energy of 6.2 eV and a wavelength of 199.84 nm, while the VUV radiation 22 in FIG. 2D has a photon energy of 8.8 eV and a wavelength of 140.8 nm. Throughout this application, the corresponding wavelength of a given photon energy may be included in parentheses following the photon energy in eV.

In FIG. 3, the Y-axis of the graph 300 illustrates the dielectric constant, or k-value of the dielectric 12 at varying radiation values. As discussed above, by exposing the dielectric 12 to the UV radiation 16, the porogens 14 in the dielectric 12 can be removed, leaving pores 20 having a very low dielectric constant (where k is approximately one (1)). In this manner, and as shown on the graph 300 in FIG. 3, the dielectric constant can be reduced to 2.43 at a photon energy of 6.2 eV. Relative to the k-value of 2.65 of the dielectric 12 before irradiation (i.e., the pristine line), and the k-value of 2.55 of the dielectric 12 after conventional UV curing, the k-value of 2.43 illustrated in the graph 300 in FIG. 3 allows the dielectric 12 to have a lower dielectric constant. In this regard, exposing the dielectric 12 to the UV radiation 16 can reduce the dielectric constant of the dielectric 12 to a desirable value.

In FIG. 4, the Y-axis of the graph 400 illustrates the elastic modulus in GPa of the dielectric 12 at varying radiation values. As discussed above, by exposing the dielectric 12 to the VUV radiation 22, the mechanical properties (such as elastic modulus) of the dielectric 12 can be enhanced. In this manner, and as shown on the graph 400 in FIG. 4, the elastic modulus can be increased to 6.0 GPa at a photon energy of 8.8 eV. Relative to the elastic modulus of 5.5 of the dielectric 12 before irradiation (i.e., the pristine line), the elastic modulus of 6.0 illustrated in the graph 400 in FIG. 4 provides the dielectric 12 with enhanced mechanical strength. Compared to the elastic modulus of 6.0 of the dielectric 12 after conventional UV curing however, the elastic modulus of the dielectric 12 after being exposed to VUV radiation 22 is approximately the same.

Thus, as illustrated in graphs 300 and 400 in FIGS. 3 and 4, using a multi-step UV/VUV process can improve the mechanical properties of the dielectric 12 comparable to conventional UV curing, while lowering the dielectric constant of the dielectric 12 relative to conventional UV curing. An additional benefit of using the multi-step UV/VUV process discussed above is that the dielectric 12 does not need to be heated by an external heat source during the exposure to the UV radiation 16 and/or the exposure to the VUV radiation 22. In conventional UV curing processes, the dielectric 12 can be heated by an external heat source during exposure to the UV radiation 16 to accelerate the removal of the porogens 14. Since curing temperatures and the thermal budget in the back end of line are often restricted, supplying the additional energy typically provided by thermal energy in the form of VUV radiation can reduce the thermal costs associated with increased UV curing temperatures.

In the following paragraphs, additional examples and experimental data are included.

Methods of curing low-k dielectric organosilicates that include porogens are provided. The methods can be carried out on films of the dielectric organosilicates after they are deposited onto a substrate. The post-deposition treatments expose the films sequentially to UV and VUV radiation to decompose porogens in the organosilicates and to improve their electrical and mechanical properties. The VUV photon energies and the UV photon energies can be selected to provide these results without the need for externally heating the dielectric and minimizing damage to the dielectric.

In at least one example, it will be shown that multi-energy photon irradiation in both the UV and VUV regions (6.2 eV and 8.8 eV, respectively) can improve the electrical and mechanical properties of low-k dielectrics simultaneously and overcome the drawbacks of UV curing without the need for thermal processing. By comparing the performance of UV curing and UV/VUV curing, it was found that the optimized UV/VUV-cured samples could achieve a lower dielectric constant compared with UV-cured samples. The mechanical properties after this processing were also improved. These investigations show that the optimum photon energies for the post-deposition treatment of SiCOH exist as a combined UV/VUV process that can be utilized as a next-generation curing method for low-k material deposition technologies.

The selection of the particular wavelengths of the photons is an important parameter for dielectric curing and is related to the dissociation energy of chemical bonds in the SiCOH matrix structures. In previous work, it has been shown that C-Hx bond-dissociation energy is approximately 5.9-6.0 eV (see H. Zheng, E. T. Ryan, Y. Nishi and J. L. Shohet, "Effect of vacuum-ultraviolet irradiation on the dielectric constant of low-k organosilicate dielectrics", Appl. Phys. Lett. 105, 202902 (2014)) and Si—O bond-conversion energy is around 8.3 eV (see H. Zheng, "Vacuum Ultraviolet Curing of Low-k Organosilicate Dielectrics", Doctoral dissertation. University of Wisconsin-Madison, Madison, Wis. (2016)). In this work, samples were irradiated with monochromatic VUV-synchrotron radiation. The advantage of a synchrotron is that it generates radiation with no charged particles and can be varied over a continuum of photon energies. This provides direct information on how photon irradiation affects the properties of porous low-k thin films. Here, SiCOH samples were exposed to various photon energies from 6.0 eV to 8.9 eV in steps of 0.1 eV. Energies higher than 8.9 eV can cause significant charge accumulation and damage the dielectrics so they were eliminated. The optimum photon-energy ranges that can simultaneously improve electrical and mechanical properties of low-k thin films can then be found.

The VUV photon beam was oriented to be normally incident on the surface of 640-nm low-k porous SiCOH samples (k=2.65) at a pressure of $10^{-8}$ Torr. The samples used in this work were deposited by PECVD on <100> p-type silicon wafers, and deposition took place in a capacitively coupled PECVD reactor utilizing a 13.56 megahertz (MHz) radio frequency (RF) source in the presence of several inert and reactive gases with an organosilane precursor. The VUV beam on the surface of the wafer had a cross-sectional area of 2.5×0.1 $cm^2$, and the exit slit width of the synchrotron beam monochromator was set to 500 micrometers (μm) to maximize the photon flux. The accumulated photon fluence for each exposure was chosen to be $1 \times 10^{15}$ photons/$cm^2$, which is comparable to the VUV photon fluence emitted during a typical plasma process. The dielectric constant was obtained from capacitance-voltage (C-V) characteristics of the SiCOH samples measured with a Signatone H-150 W probe station. Mechanical properties such as elastic modulus and hardness of the tested samples were found from nanoindentation measurements. The hardness of UV-cured SiCOH increases and then decreases with the increased indentation depth, thus forming a peak. It is not clear at present about the mechanism that causes the hardness parameter to first increase and then decrease at small indentation depths. Wang and Grill et al. (see L. Wang, M. Ganor, S. I. Rokhlin and A. Grill, "Nanoindentation analysis of mechanical properties of low to ultralow dielectric constant SiCOH films", J. Mater. Res, 20 2080 (2005)) hypothesized that this phenomenon is caused by the non-uniform distribution of pores within SiCOH after curing. That is, if there are more pores at a layer near the surface of SiCOH, the measured hardness will be small. Then if the indentation depth increases, and there are fewer pores in the deeper layers of SiCOH, the measured hardness will be higher. If the indenter moves further within the low-k thin films, and if there are more pores in the even deeper layers of SiCOH, the hardness will decrease again. Another possibility is that the phenomenon might be due to the nanoindenter crushing the pores and increasing the density as it moves deeper into the sample (see H. Zheng, "Vacuum Ultraviolet Curing of Low-k Organosilicate Dielectrics," Doctoral dissertation. University of Wisconsin-Madison, Madison, Wis. (2016)). It is much like an airplane wing moving through the air or a boat going through the water: for the airplane wing, the air compression changes with distance in front of the wing and for the boat, water could occupy a larger volume in front of the boat but then it swells up. Therefore, the hardness of UV-cured SiCOH increases and then decreases with the increased indentation depth. Since there is no porosity (pores) generated in uncured samples, as-deposited SiCOH samples do not exhibit this phenomenon. Thus, in this work, the elastic modulus is utilized to represent the performance of mechanical properties of SiCOH.

A probe station (Signatone H-150 W) with a low-power optical microscope was used to make contact with a fabricated Metal-Insulator-Silicon (MIS) structure for all of the electrical measurements in this project. This probe station had three movable micro-positioners with 5 μm diameter tungsten probe tips (Signatone SE-T) (see M. T. Nichols, K. Mavrakakis, Q. Lin and J. L. Shohet, "The effects of plasma exposure and vacuum ultraviolet irradiation on photopatternable low-k dielectric materials", J. Appl. Phys. 114, 104107 (2013)). The sample under test was positioned on an electrically-floating stainless-steel wafer platen that can be moved with submicron resolution in the x-y plane using micrometers. A 300-nm titanium metal layer was deposited on the surface of the dielectric to form an MIS structure. Electrical contact was made to the semiconducting substrate by connecting one of the tungsten probes to the wafer plate. Electrical contact to the metal pads was made by carefully lowering the tungsten probe tip to the metal surface. The probe tip was held at an oblique angle relative to the sample surface to minimize damaging the electrode by the sharp point of the tip (see R. S. Muller and T. I. Kamins, Device Electronics for Integrated Circuits, John Wiley & Sons, New York, (2003)). Specific care was taken to ensure that stray light and electrical noise did not influence any of the measurements. This was accomplished by placing an electrically-shielded dark box over the entire probe station for each measurement.

For current-voltage measurements, a computer-controlled combination high-voltage supply and picoammeter was used (Keithley 6487), while for C-V measurements, an HP 4285A precision inductance-capacitance-resistance (LCR) meter was utilized instead. The measurements of the MIS C-V characteristics were made in the high-frequency regime (~1 MHz). Specially written LabVIEW instrumentation software was used to automate the data collection.

The elastic modulus ($E_s$) and Meyer hardness (H), of SiCOH films were investigated with a Hysitron (Minneapolis, JVIN, USA) Triboindenter equipped with a Berkovich probe and operated in open-loop mode. The machine compliance was evaluated using data from a series of indents with different loads placed in the center of a fused-silica standard and the SYS correlation (see D. S. Stone, K. B. Yoder, and W. D. Sproul, "Hardness and elastic modulus of TiN based on continuous indentation technique and new correlation", J. Vac. Sci. Technol. A 9, 2543 (1991)). Both calibration and SiCOH experiments utilized a load-control indent including an initial 20-nm lift-off and re-approach in order to define the initial contact point accurately. This was followed by a five second (5 s) loading, a 5 s hold at maximum load (Pmax), a 2 s unloading to 40% of the Pmax, a 60 s hold at 40% Pmax to remove thermal-drift effects, and a 1 s final unload. After correcting the fused silica load-depth traces for machine compliance, a series of indents were used to calculate the area function (see X. Guo, J. E. Jakes, M. T. Nichols, S. Banna, Y. Nishi and J. L. Shohet, "The effect of water uptake on the mechanical properties of low-k organosilicate glass", J. Appl. Phys. 114, 084103 (2013)) following the standard Oliver-Pharr method (see W. C. Oliver and G. M. Pharr, "An improved technique for determining hardness and elastic modulus using load and displacement sensing indentation experiments", J. Mater. Res. 7, 1564 (1992)). All nanoindentation experiments were carried out at room temperature in air ambient.

It should be noted that since the usual nanoindentation procedures rely on hardness (H) and elastic modulus ($E_{eff}$) readings generated by the nanoindentation instrument based on the penetration depth and indenter shape, the substrate of a thin film will have an increased effect on H and $E_{eff}$ as the penetration depth increases. For thin films deposited on a hard substrate, as is the case of porous low-k films on a Si substrate, the results are usually overestimated and unconvincing if the effects of the hard substrate are not considered. Also, for the porous structure of SiCOH, film densification underneath the probe could be significant during the indentation process, which brings additional challenges to nanoindentation analysis. To solve these problems, Stone's algorithms (see D. S. Stone, K. B. Yoder and W. D. Sproul, "Hardness and elastic modulus of TiN based on continuous indentation technique and new correlation", J. Vac. Sci. Technol. A, 9, 2543 (1991) and D. S. Stone, "Elastic rebound between an indenter and a layered specimen: part I. model", J. Mater. Res., 13, 3207 (1998)) were utilized to compare the experimental nanoindentation measurements as a function of indent size with Stone's theoretical simulations (see D. S. Stone, "Elastic rebound between an indenter and a layered specimen: part I. model", J. Mater. Res., 13, 3207 (1998)).

The thickness of the dielectric layer was measured with a Filmetrics F-20 Optical reflectometer in the clean room at the Wisconsin Center for Microelectronics (WCAM) and confirmed with a Rudolph AutoELII-Vis-3 Ellipsometer. Both the reflectometer and the ellipsometer use algorithms to calculate the dielectric thickness. Initial values (such as the approximate value of thickness and refractive index of the tested samples) need to be entered into the software to start the calculation. The ellipsometer can make an accurate measurement if the approximate value of both the thickness and the refractive index are known. In this case, however, only the thickness of the tested sample (around 500 nm) is known, so we rely on the reflectometer measurements. The measured refractive index from the reflectometer is also used as an initial input in the ellipsometer along with the measured thickness of the tested sample to make sure the result is convincing.

Table 1 shows the dielectric constants of the test samples after photon exposure and Table 2 summarizes the changes to the elastic modulus ($E_s$) of the samples after exposure. The percentage changes of these properties were all calculated based on the same measurements made for the as-deposited (no exposure) samples.

TABLE 1

Effect of VUV irradiation on dielectric constant of SiCOH as a function of photon energy (photon fluence $10^{15}$ photons/cm$^2$)

| Tested Sample (SiCOH) under different photon irradiations | K value (measured in 1 MHz) by probe station |
|---|---|
| 0 eV | 2.65 |
| 4.5 eV | 2.74 |
| 5.0 eV | 2.73 |
| 5.5 eV | 2.71 |
| 5.9 eV | 2.70 |
| 6.0 eV | 2.63 |
| 6.1 eV | 2.51 |
| 6.2 eV | 2.43 |
| 6.3 eV | 2.51 |
| 6.5 eV | 2.53 |
| 7.0 eV | 2.56 |
| 8.0 eV | 2.59 |
| 8.2 eV | 2.54 |
| 8.4 eV | 2.57 |
| 8.6 eV | 2.60 |
| 8.8 eV | 2.62 |
| 8.9 eV | 2.63 |
| UV cured sample | 2.55 |

TABLE 2

Elastic modulus ($E_s$) of tested samples after VUV exposure (photon fluence $10^{15}$ photons/cm$^2$)

| Material | Exposure conditions | Elastic modulus (GPa) | Percentage changes in modulus |
|---|---|---|---|
| as-deposited | 6.0-8.2 eV | 5.5 ± 0.2 | 0 |
| as-deposited | 8.3 eV | 5.8 ± 0.1 | 5.9% |
| as-deposited | 8.4 eV | 5.6 ± 0.1 | 3.1% |
| as-deposited | 8.5 eV | 5.6 ± 0.1 | 3.0% |

TABLE 2-continued

Elastic modulus ($E_s$) of tested samples after VUV exposure (photon fluence $10^{15}$ photons/cm$^2$)

| Material | Exposure conditions | Elastic modulus (GPa) | Percentage changes in modulus |
|---|---|---|---|
| as-deposited | 8.6 eV | 5.7 ± 0.1 | 4.3% |
| as-deposited | 8.7 eV | 5.8 ± 0.2 | 6.1% |
| as-deposited | 8.8 eV | 6.0 ± 0.2 | 8.8% |
| as-deposited | 8.9 eV | 5.9 ± 0.1 | 7.6% |
| as-deposited | — | 6.0 ± 0.1 | 9.1% |

Since 6.2 eV exposure achieved the best performance to lower the dielectric constant of SiCOH while 8.8 eV VUV exposure achieved the best improvement in the elastic modulus, the performance of these monochromatically-cured tested samples was compared with the UV-cured samples and is shown in Table 3. The improvement of the electrical and mechanical properties may be explained by porogen removal and strength enhancement of the backbone structures of the low-k tested samples.

TABLE 3

Comparison of monochromatic VUV curing and UV curing (photon fluence $10^{15}$ photons/cm$^2$)

| | K value | Elastic Modulus (GPa) |
|---|---|---|
| 6.2 eV exposed | 2.43 | 5.5 |
| 8.8 eV exposed | 2.62 | 6.0 |
| UV cured | 2.55 | 6.0 |

It was found that none of the monochromatic VUV exposures achieved the purpose of improving both the electrical and mechanical properties of tested low-k dielectrics. That is, the lower-energy curing (6.2 eV) could achieve a much lower dielectric constant compared with the UV-cured samples. However, this energy may not be sufficient to improve the mechanical properties of the sample. Instead, 8.8 eV photons may improve the mechanical properties of the low-k thin films at a level comparable to conventionally UV-cured samples, but here, the dielectric constant can be much higher due to carbon loss (methyl dissociation) and incomplete porogen removal. Therefore, a multi-step UV/VUV curing was determined to best achieve the goal of improving both electrical and mechanical properties simultaneously without the need for thermal heating.

The multi-energy method is as follows. First, the samples were exposed to 6.2 eV photons to remove the porogen residues. Then, the samples were re-exposed to 8.8 eV VUV photons to enhance the mechanical properties of low-k dielectrics. No thermal heating was used.

The results are shown in Table 4. In using this method, it was found that the multi-step UV/VUV curing can achieve the mechanical property improvement of low-k dielectrics that is comparable to the UV curing while the dielectric constant is much lower. The curing performance of 6.2 eV+8.8 eV and 8.8 eV+6.2 eV irradiation were tested, and the order of irradiation did not affect the experimental results. However, it is recommended to first irradiate with UV (6.2 eV) followed by VUV (8.8 eV) irradiation since a lower dielectric constant is always the most important issue for SiCOH, and the UV wavelength alone might lower the dielectric constant without inducing bad effects such as methyl group dissociation. As a result, porogen removal could be tracked during the UV irradiation in the first step without changing any methyl, Si—O, and other related chemical bonds. Once the porogens are removed, the photon irradiation should be switched to the VUV range to improve the mechanical properties. If VUV irradiation is undertaken at first, the relatively high-energy VUV photons could start to break chemical bonds, and in-situ measurements or testing may not be helpful. Therefore, UV/VUV curing is recommended.

TABLE 4

Comparison of optimized multi-step UV/VUV curing and UV curing (photon fluence $10^{15}$ photons/cm$^2$)

| | K value | Elastic Modulus (GPa) |
|---|---|---|
| 8.8 eV + 6.2 eV exposed | 2.51 | 6.0 |
| Industrially UV cured | 2.55 | 6.0 |

Figure 5:
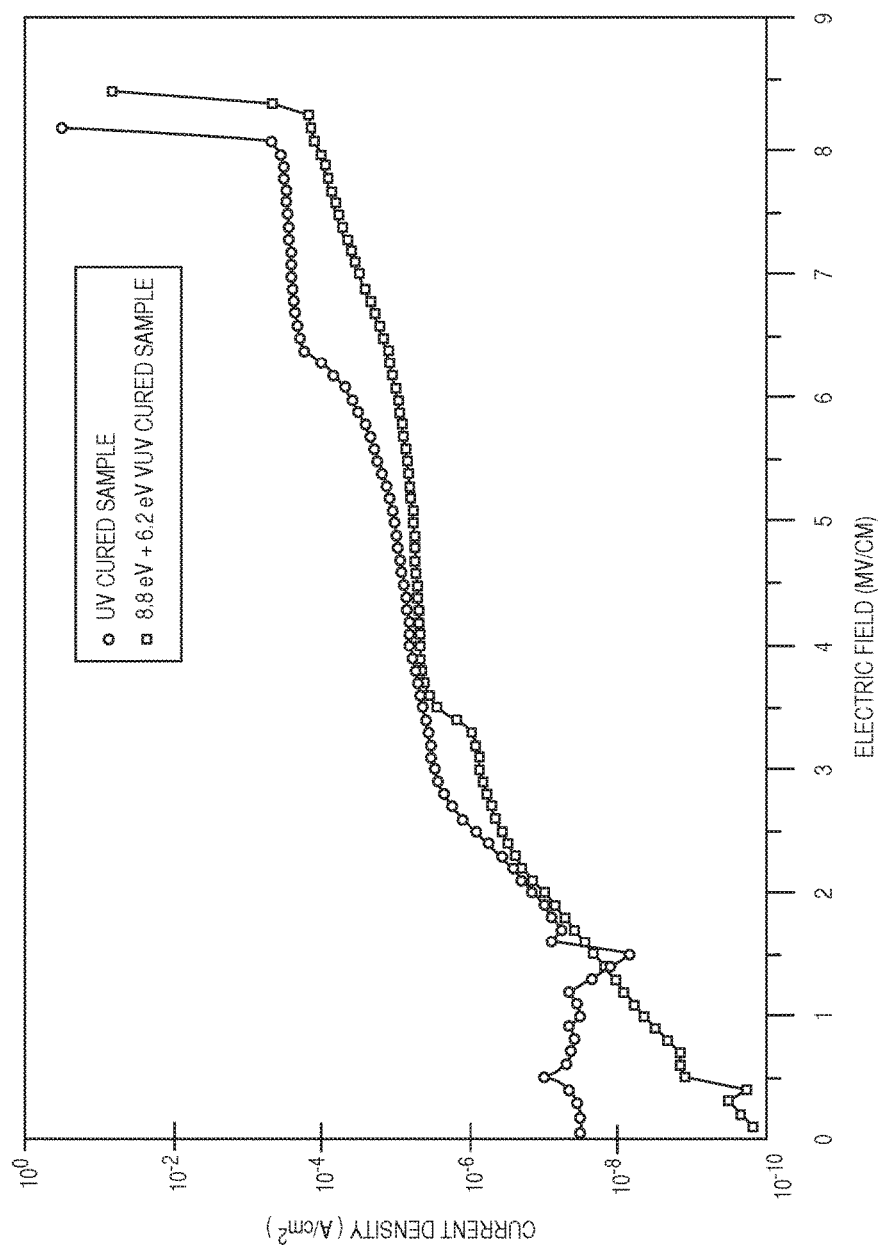
FIG. 5 is a graph illustrating the IV characteristics of UV/VUV-cured SiCOH samples compared with the UV cured SiCOH samples.

Moreover, the IV characteristics show that the multi-step UV/VUV cured SiCOH samples achieved a lower leakage current and higher breakdown voltage compared with the UV-cured samples in this example. The result is shown in FIG. 5. For each IV curve, seven test structures were measured and averaged to minimize experimental error. UV/VUV-cured SiCOH shows an increase in the breakdown voltage (Vbct) of the SiCOH sample compared with the conventionally UV-cured low-k SiCOH samples (427.5±2.5 V versus 395±5 V). It also shows a good improvement in reliability for low-k dielectrics after UV/VUV curing. This is believed to be due to the sufficient removal of porogens in low-k thin films since the conductivity of porogen residues is much higher than the backbone of low-k dielectrics.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

Those skilled in the art will recognize improvements and modifications to the preferred embodiments of the present disclosure. All such improvements and modifications are considered within the scope of the concepts disclosed herein and the claims that follow.

The following references may aid in the understanding of related concepts and as such are hereby incorporated herein by reference in their entirety:

H. Zheng, E. T. Ryan, Y. Nishi and J. L. Shohet, "Effect of vacuum-ultraviolet irradiation on the dielectric constant of low-k organosilicate dielectrics", Appl. Phys. Lett. 105, 202902 (2014);

H. Zheng, "Vacuum Ultraviolet Curing of Low-k Organosilicate Dielectrics", Doctoral dissertation. University of Wisconsin-Madison, Madison, Wis. (2016);

L. Wang, M. Ganor, S. I. Rokhlin and A. Grill, "Nanoindentation analysis of mechanical properties of low to ultralow dielectric constant SiCOH films", J. Mater. Res, 20 2080 (2005);

M. T. Nichols, K. Mavrakakis, Q. Lin and J. L. Shohet, "The effects of plasma exposure and vacuum ultraviolet irradiation on photopatternable low-k dielectric materials", J. Appl. Phys. 114, 104107 (2013);

R. S. Muller and T. I. Kamins, Device Electronics for Integrated Circuits, John Wiley & Sons, New York, (2003);

X. Guo, J. E. Jakes, M. T. Nichols, S. Banna, Y. Nishi and J. L. Shohet, "The effect of water uptake on the mechanical properties of low-k organosilicate glass", J. Appl. Phys. 114, 084103 (2013);

W. C. Oliver and G. M. Pharr, "An improved technique for determining hardness and elastic modulus using load and displacement sensing indentation experiments", J. Mater. Res. 7, 1564 (1992);

D. S. Stone, K. B. Yoder and W. D. Sproul, "Hardness and elastic modulus of TiN based on continuous indentation technique and new correlation", J. Vac. Sci. Technol. A, 9, 2543 (1991); and D. S. Stone, "Elastic rebound between an indenter and a layered specimen: part I. model", J. Mater. Res., 13, 3207 (1998).

What is claimed is:

1. A method comprising:
   providing a substrate;
   forming a dielectric comprising porogens over the substrate;
   subjecting the dielectric to a first pressure greater than 10 Torr;
   while subjecting the dielectric to the first pressure, exposing the dielectric to ultraviolet (UV) radiation having one or more photon energies less than or equal to seven electronvolts (7 eV);
   subjecting the dielectric to a second pressure less than $1 \times 10^{-3}$ Torr;
   while subjecting the dielectric to the second pressure, exposing the dielectric to vacuum UV (VUV) radiation having one or more photon energies greater than 7 eV.

2. The method of claim 1, wherein the dielectric comprises an organosilicate.

3. The method of claim 2, wherein a dielectric constant of the dielectric is at least two percent (2%) lower than before being exposed to the UV radiation and the VUV radiation.

4. The method of claim 2, wherein an elastic modulus of the dielectric is at least five percent (5%) higher than before being exposed to the UV radiation and the VUV radiation.

5. The method of claim 1, wherein:
   the UV radiation has one or more photon energies between 3 eV and 7 eV; and
   the VUV radiation has one or more photon energies between 7.25 eV and 12 eV.

6. The method of claim 5, wherein the dielectric comprises an organosilicate.

7. The method of claim 1, wherein:
   the UV radiation has one or more photon energies between 5.5 eV and 7 eV; and
   the VUV radiation has one or more photon energies between 8 eV and 9.5 eV.

8. The method of claim 7, wherein the dielectric comprises an organosilicate.

9. The method of claim 7, wherein the dielectric is not heated by an external heat source during the exposure to the UV radiation and the exposure to the VUV radiation.

10. The method of claim 1, wherein the VUV radiation has one or more photon energies between 8.3 eV and 8.9 eV.

11. The method of claim 10, wherein the UV radiation has one or more photon energies between 6 eV and 6.5 eV.

12. The method of claim 11, wherein the dielectric comprises an organosilicate.

13. The method of claim 12, wherein the dielectric is not heated by an external heat source during the exposure to the UV radiation and the exposure to the VUV radiation.

14. The method of claim 13, wherein the second pressure is between $1 \times 10^{-4}$ Torr and $1 \times 10^{-7}$ Torr.

15. The method of claim 11, wherein the UV radiation has one or more photon energies of about 6.2 eV.

16. The method of claim 10, wherein the VUV radiation has one or more photon energies of about 8.8 eV.

17. The method of claim 1, wherein:
   the first pressure is greater than 10 Torr and less than or equal to 1000 Torr; and
   the second pressure is less than $1 \times 10^{-4}$ Torr.

18. The method of claim 1, wherein the dielectric is exposed to the UV radiation before it is exposed to the VUV radiation.

19. The method of claim 1, wherein the VUV radiation is normally incident on a surface of the dielectric.

20. The method of claim 1, wherein the dielectric is not heated by an external heat source during the exposure to the UV radiation and the exposure to the VUV radiation.

21. The method of claim 1, wherein the VUV radiation has a photon fluence greater than or equal to $1 \times 10^{14}$ photons per centimeter squared.

22. The method of claim 1, wherein the VUV radiation has a photon fluence greater than or equal to $1 \times 10^{16}$ photons per centimeter squared.

23. The method of claim 1, wherein the VUV radiation has a photon fluence greater than or equal to $1 \times 10^{14}$ photons per centimeter squared and less than or equal to $1 \times 10^{16}$ photons per centimeter squared.

24. The method of claim 1, wherein the VUV radiation has a photon fluence greater than or equal to $1 \times 10^{14}$ photons per centimeter squared and less than or equal to $1 \times 10^{17}$ photons per centimeter squared.

25. The method of claim 1, wherein the VUV radiation has a photon fluence greater than or equal to $1 \times 10^{15}$ photons per centimeter squared and less than or equal to $1 \times 10^{16}$ photons per centimeter squared.

26. The method of claim 1, wherein:
   a dielectric constant of the dielectric is at least two percent (2%) lower than before being exposed to the UV radiation and the VUV radiation; and
   the VUV radiation has a photon fluence greater than or equal to $1 \times 10^{14}$ photons per centimeter squared and less than or equal to $1 \times 10^{16}$ photons per centimeter squared.

27. The method of claim 1, wherein:
   a dielectric constant of the dielectric is greater than or equal to 2.4 and less than or equal to 2.75 after being exposed to the UV radiation and the VUV radiation; and
   the VUV radiation has a photon fluence greater than or equal to $1 \times 10^{14}$ photons per centimeter squared and less than or equal to $1 \times 10^{16}$ photons per centimeter squared.

28. The method of claim 1, wherein:
a dielectric constant of the dielectric is greater than or equal to 2.43 and less than or equal to 2.74 after being exposed to the UV radiation and the VUV radiation; and
the VUV radiation has a photon fluence greater than or equal to $1\times10^{14}$ photons per centimeter squared and less than or equal to $1\times10^{16}$ photons per centimeter squared.

29. The method of claim 1, wherein:
the first pressure is greater than 10 Torr and less than or equal to 1000 Torr;
the second pressure is between $1\times10^{-4}$ Torr and $1\times10^{-7}$ Torr; and
the VUV radiation has a photon fluence greater than or equal to $1\times10^{14}$ photons per centimeter squared and less than or equal to $1\times10^{17}$ photons per centimeter squared.

* * * * *

UNITED STATES PATENT AND TRADEMARK OFFICE
CERTIFICATE OF CORRECTION

PATENT NO. : 10,090,150 B2
APPLICATION NO. : 15/696930
DATED : October 2, 2018
INVENTOR(S) : J. Leon Shohet et al.

It is certified that error appears in the above-identified patent and that said Letters Patent is hereby corrected as shown below:

In the Specification

In Column 5, Line 25, replace "$1\times10^{-5}$ Torr" with --$1\times10^{-8}$ Torr--.

In the Claims

In Column 14, second line of Claim 22, replace "$1\times10^{16}$ photons" with --$1\times10^{15}$ photons--.

Signed and Sealed this
Eleventh Day of December, 2018

Andrei Iancu
*Director of the United States Patent and Trademark Office*